United States Patent
Cho et al.

(10) Patent No.: US 9,865,212 B2
(45) Date of Patent: Jan. 9, 2018

(54) DISPLAY DEVICE

(71) Applicant: Samsung Display Co., Ltd., Yongin (KR)

(72) Inventors: Duc-Han Cho, Seoul (KR); Kang Nam Kim, Asan-si (KR); Beom Jun Kim, Seoul (KR); You Mee Hyun, Bucheon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 22 days.

(21) Appl. No.: 14/742,915

(22) Filed: Jun. 18, 2015

(65) Prior Publication Data

US 2016/0171950 A1 Jun. 16, 2016

(30) Foreign Application Priority Data

Dec. 12, 2014 (KR) .................. 10-2014-0179321

(51) Int. Cl.
*G09G 3/36* (2006.01)
*G11C 19/28* (2006.01)

(52) U.S. Cl.
CPC ......... *G09G 3/3677* (2013.01); *G09G 3/3648* (2013.01); *G09G 2310/0283* (2013.01); *G09G 2310/0286* (2013.01); *G09G 2310/08* (2013.01); *G09G 2330/021* (2013.01); *G11C 19/287* (2013.01)

(58) Field of Classification Search
CPC .... G11C 19/00; G11C 19/287; G90G 3/3677; G09G 2310/08; G09G 2310/0283; G09G 2310/0286; G09G 2310/0202; G09G 2310/0205; G09G 2310/021; G09G 3/3677; G09G 3/3696; G09G 3/3648; G09G 3/3607; G09G 2300/0809; G09G 2300/0842; G09G 2330/023; G09G 2330/021
USPC .................. 345/87–104, 212; 377/64, 69
See application file for complete search history.

(56) References Cited

U.S. PATENT DOCUMENTS

| | | | |
|---|---|---|---|
| 2008/0219401 A1* | 9/2008 | Tobita | G09G 3/3677 377/79 |
| 2009/0086116 A1* | 4/2009 | Pak | G09G 3/3655 349/38 |
| 2013/0027378 A1 | 1/2013 | Lee et al. | |

FOREIGN PATENT DOCUMENTS

| KR | 1020130012382 | 2/2013 |
|---|---|---|
| KR | 1020130012392 | 2/2013 |
| KR | 1020140111633 | 9/2014 |

* cited by examiner

*Primary Examiner* — Jimmy H Nguyen
(74) *Attorney, Agent, or Firm* — Cantor Colburn LLP (57) ABSTRACT

A display device includes: a plurality of pixels; a plurality of gate lines connected to the plurality of pixels; an output terminal connected to a gate line of the gate lines; a first transistor connected to a first node, a first clock signal input terminal and the output terminal; a second transistor connected to a second clock signal input terminal, a low-level power voltage and the output terminal; a third transistor connected to a second node, the low-level power voltage and the first node; a fourth transistor connected to a first forward input terminal, the low-level power voltage and the second node; and a fifth transistor connected to a first backward input terminal, the low-level power voltage and the second node.

23 Claims, 5 Drawing Sheets

DISPLAY DEVICE

This application claims priority to Korean Patent Application No. 10-2014-0179321 filed on Dec. 12, 2014, and all the benefits accruing therefrom under 35 U.S.C. §119, the content of which in its entirety is herein incorporated by reference.

BACKGROUND (a) Field

Exemplary embodiments of the invention relate to a display device, and more particularly, to a display device with reduced layout area of a gate driving circuit and reduced power consumption.

(b) Description of the Related Art

Currently, display devices such as a liquid crystal display, a field emission display, a plasma display panel, and an organic light emitting display have been widely used.

Such a display device typically includes a plurality of gate lines disposed in a row direction, a plurality of data lines disposed in a column direction, and a plurality of pixels arranged at points where the plurality of gate lines and the plurality of data lines cross each other. The plurality of pixels is typically driven by gate signals and data voltages transferred by the plurality of gate lines and the plurality of data lines.

In a display device, a plurality of clock signals may be used in a gate driving circuit for sequentially applying the gate signals to the plurality of gate lines. In such a display device, a plurality of capacitors may be included in the gate driving circuit. The capacitors occupy a large part of the layout area of the gate driving circuit and increase power consumption. That is, as the number of capacitors included in the gate driving circuit is increased, the layout area of the gate driving circuit and power consumption are increased.

Recently, display devices having minimized non-display area around a display area where images are displayed, e.g., a display device with slim bezels, have been manufactured, and researches for reducing the power consumption of the display device have been conducted.

SUMMARY

Exemplary embodiments of the invention relate to a display device including a gate driving circuit having reduced layout area and reduced power consumption.

An exemplary embodiment of the invention, a display device includes: a plurality of pixels; a plurality of gate lines connected to the plurality of pixels; an output terminal connected to a gate line of the plurality of gate liens; a first transistor including a gate electrode connected to a first node, a first end connected to a first clock signal input terminal, and a second end connected to the output terminal; a second transistor including a gate electrode connected to a second clock signal input terminal, a first end connected to a low-level power voltage, and a second end connected to the output terminal; a third transistor including a gate electrode connected to a second node, a first end connected to the low-level power voltage, and a second end connected to the first node; a fourth transistor including a gate electrode connected to a first forward input terminal to which a gate signal earlier than the gate signal output from the output terminal by a first period is input, a first end connected to the low-level power voltage, and a second end connected to the second node; and a fifth transistor including a gate electrode connected to a first backward input terminal to which a gate signal later than the gate signal output from the output terminal by the first period is input, a first end connected to the low-level power voltage, and a second end connected to the second node.

In an exemplary embodiment, the display device may further include a sixth transistor including a gate electrode connected to a second forward input terminal to which a gate signal earlier than the gate signal output from the output terminal by a second period is input, a first end connected to a forward driving input terminal, and a second end connected to the first node.

In an exemplary embodiment, the display device may further include a seventh transistor including a gate electrode connected to a second backward input terminal to which a gate signal later than the gate signal output from the output terminal by the second period is input, a first end connected to a backward driving input terminal, and a second end connected to the first node.

In an exemplary embodiment, the display device may further include an eighth transistor including a gate electrode connected to the second node, a first end connected to the low-level power voltage, and a second end connected to the output terminal.

In an exemplary embodiment, the display device may further include a ninth transistor including a gate electrode connected to the first clock signal input terminal, a first end connected to the first clock signal input terminal, and a second end connected to the second node.

In an exemplary embodiment, the display device may further include a tenth transistor including a gate electrode connected to the second clock signal input terminal, a first end connected to the low-level power voltage, and a second end connected to the second node.

In an exemplary embodiment, the display device may further include a capacitor including a first end connected to the first node and a second end connected to the output terminal.

In an exemplary embodiment, at least one of the first transistor, the second transistor, the third transistor, the fourth transistor, the fifth transistor, the sixth transistor, the seventh transistor, the eighth transistor, the ninth transistor, and the tenth transistor may be an n-channel field effect transistor.

In an exemplary embodiment, at least one of the first transistor, the second transistor, the third transistor, the fourth transistor, the fifth transistor, the sixth transistor, the seventh transistor, the eighth transistor, the ninth transistor and the tenth transistor may be an oxide thin film transistor.

In an exemplary embodiment, during a forward driving in which the gate signals are sequentially applied to the plurality of gate lines connected to the plurality of pixels in a forward direction, the forward driving signal input to the forward driving input terminal may be in a gate-on voltage level, and the backward driving signal input to the backward driving input terminal may be in a gate-off voltage level.

In an exemplary embodiment, during a backward driving in which the gate signals are sequentially applied to the plurality of gate lines connected to the plurality of pixels in a backward direction, the forward driving signal input to the forward driving input terminal may be in a gate-off voltage level, and the backward driving signal input to the backward driving input terminal may be in a gate-on voltage level.

In an exemplary embodiment, the first period may be one-fourth of one horizontal period, and the second period may be the one horizontal period.

In an exemplary embodiment, a clock signal input to the second clock signal input terminal may be a reverse signal of a clock signal input to the first clock signal input terminal.

In an exemplary embodiment, when the gate signal in a gate-on voltage level is input to the second forward input terminal, the clock signal input to the second clock signal input terminal may be in the gate-on voltage level.

In an exemplary embodiment, when the gate signal in the gate-on voltage level is input to the second forward input terminal, the gate signal in the gate-off voltage level may be output from the output terminal.

In an exemplary embodiment, when the gate signal in the gate-on voltage level is input to the second forward input terminal, the capacitor may be charged at a voltage input to the forward driving input terminal.

In an exemplary embodiment, when the clock signal input to the first clock signal input terminal is in the gate-on voltage level after the capacitor is charged, at least one of the gate signal input to the first forward input terminal and the gate signal input to the second forward input terminal may be in the gate-on voltage level.

In an exemplary embodiment, when the clock signal input to the first clock signal input terminal is in the gate-on voltage level, at least one of the gate signal input to the first forward input terminal and the gate signal input to the first backward input terminal may be in the gate-on voltage level, and the first node may be in a floated state.

In an exemplary embodiment, when the clock signal input to the first clock signal input terminal is in the gate-on voltage level, the voltage of the second node may become a gate-off voltage earlier by the first period and be maintained at the gate-off voltage later by the first period.

In an exemplary embodiment, when the first node is in the floated state, the clock signal in the gate-on voltage level and input to the first clock signal input terminal may be transferred to the output terminal, and the gate signal in the gate-on voltage level may be output from the output terminal.

According to exemplary embodiments of the invention, a layout area of the gate driving circuit in the display device and the power consumption of the gate driving circuit are substantially reduced.

BRIEF DESCRIPTION OF THE DRAWINGS

These and/or other features of the invention will become apparent and more readily appreciated from the following detailed description of embodiments thereof, taken in conjunction with the accompanying drawings, in which.

DETAILED DESCRIPTION OF THE EMBODIMENTS

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" or "coupled to" another element, it can be directly on or coupled to the other element or intervening elements may be present therebetween. In contrast, when an element is referred to as being "directly on" or "directly coupled to" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of a display device according to the invention will be described in detail with reference to the accompanying drawings. In such embodiment, the display device may be any one of a liquid crystal display, a field emission display, a plasma display panel, and an organic light emitting display. Hereinafter, for convenience of description, exemplary embodiment, where the display device is the liquid crystal display will be described in detail.

Figure 1:
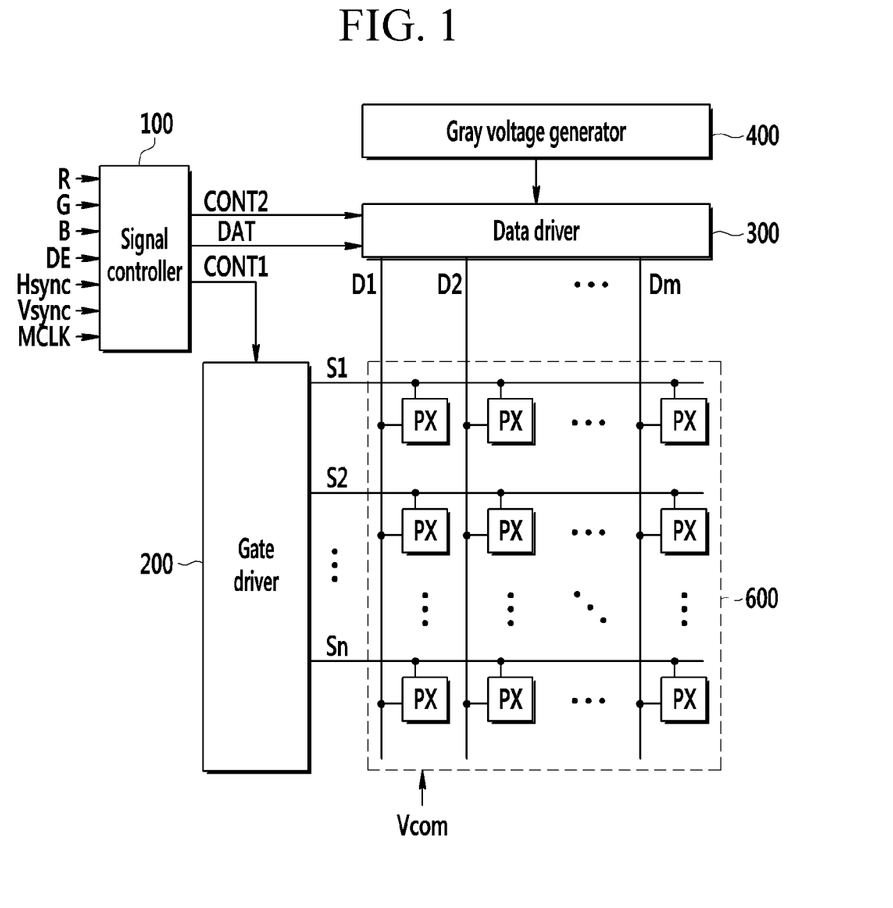
FIG. 1 is a block diagram of an exemplary embodiment of a display device according to the invention.

FIG. 1 is a block diagram of an exemplary embodiment of a display device according to the invention.

Referring to FIG. 1, an exemplary embodiment of the display device includes a signal controller 100, a gate driver 200, a data driver 300, a gray voltage generator 400 and a display unit 600.

In such an embodiment, the display unit 600 includes a plurality of gate lines S1-Sn, a plurality of data lines D1-Dm, and a plurality of pixels PX. The plurality of pixels PX is connected to the plurality of gate lines S1-Sn and the plurality of data lines D1-Dm and arranged substantially in a matrix form. Here, n and m are natural numbers. The plurality of gate lines S1-Sn extends substantially in a row direction (e.g., horizontal direction) to be substantially parallel to each other. The plurality of data lines D1-Dm extends substantially in a column direction (e.g., a vertical direction) to be substantially parallel to each other. In such an embodiment, a back light (not illustrated) for controlling luminance of an image displayed on the display unit 600 may be provided on a rear surface of the display unit 600. The back light emits light to the display unit 600. A common voltage Vcom for driving the pixels PX may be applied to the display unit 600.

In such an embodiment, the signal controller 100 receives image signals R, G and B and an input control signal. The image signals R, G and B include luminance information of the plurality of pixels. The luminance may have a predetermined number of grayscale levels, for example, $1024(=2^{10})$, $256(=2^{8})$ or $64(=2^{6})$ of grayscale levels. The input control signal may include a data enable signal DE, a horizontal synchronization signal Hsync, a vertical synchronization signal Vsync, and a main clock signal MCLK.

In such an embodiment, the signal controller 100 generates a gate control signal CONT1, a data control signal CONT2 and an image data signal DAT based on the image signals R, G and B, the data enable signal DE, the horizontal synchronization signal Hsync, the vertical synchronization signal Vsync and the main clock signal MCLK. The signal controller 100 may generate an image data signal DAT by dividing the image signals R, G and B by a frame unit based on the vertical synchronization signal Vsync, and dividing the image signals R, G and B by a scan line unit based on the horizontal synchronization signal Hsync.

In such an embodiment, the signal controller 100 provides the image data signal DAT and the data control signal CONT2 to the data driver 300. The data control signal CONT2, which is a signal for controlling an operation of the data driver 300, may include a horizontal synchronization start signal for notifying the transmission start of the image data signal DAT, a load signal for indicating the output of the data signal to the data lines D1-Dm, and a data clock signal. The data control signal CONT2 may further include a reverse signal for inverting a voltage polarity of the image data signal DAT for the common voltage Vcom.

The signal controller 100 provides the gate control signal CONT1 to the gate driver 200. The gate control signal CONT1 includes a clock signal (i.e., one or more clock signals) for controlling the output of the scanning start signal STV and the gate-on voltage from the gate driver 200. The gate control signal CONT1 may further include an output enable signal for limiting the duration of the gate-on voltage.

The gate driver 200 is connected to the plurality of gate lines S1-Sn and applies a gate signal, which is configured in combination of a gate-on voltage and a gate-off voltage for turning on and off a switching element (e.g., Q in FIG. 2) connected to the plurality of gate lines S1-Sn, to the plurality of gate lines S1-Sm.

The data driver 300 is connected to the plurality of data lines and selects a gray voltage from a plurality of gray voltages generated from the gray voltage generator 400. The data driver 300 applies the selected gray voltage to the data lines D1-Dm as the data voltage. In an exemplary embodiment, the gray voltage generator 400 may provide only a predetermined number of reference gray voltages without providing voltages for all grayscale levels. In such an embodiment, the data driver 300 may divide the reference gray voltage to generate gray voltages for all of the grayscale levels and select the data voltages among the generated gray voltages.

A difference between the data voltage applied to the pixel PX and the common voltage Vcom is represented as a charging voltage of a liquid crystal capacitor (e.g., Clc in FIG. 2), that is, a pixel voltage. The arrangement of the liquid crystal molecules varies based on a magnitude of the pixel voltage, and as a result, polarization of light passing through the liquid crystal layer 3 is changed. The change in the polarization is represented as a change in transmittance of light by a polarizer, and as a result, the pixel PX displays luminance expressed by grayscales of the image signals R, G and B.

Figure 5:
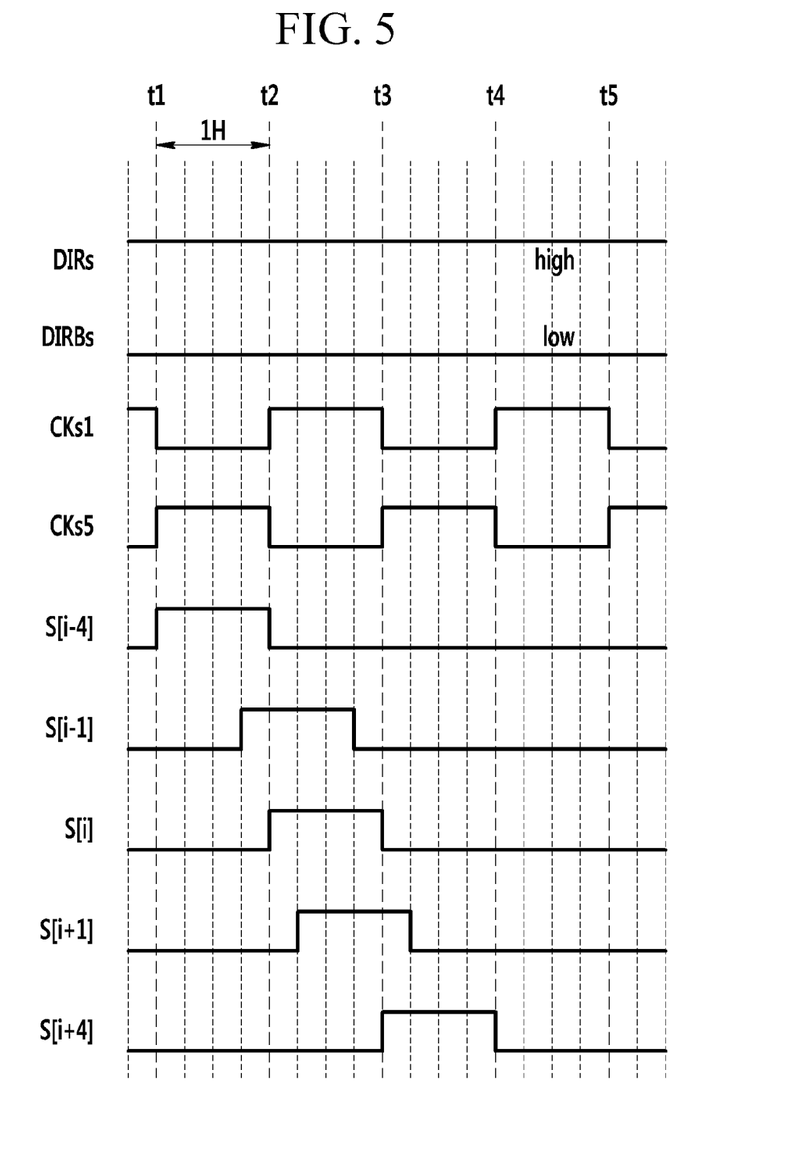
FIG. 5 is a timing diagram showing an operation of an exemplary embodiment of the gate driving circuit of the display device, according to the invention.

Gate signals in the gate-on voltage level are sequentially applied to the plurality of gate lines S1-Sm by setting 1 horizontal period as a unit and the data voltages are applied to the plurality of data lines D1-Dm corresponding to the gate signals in the gate-on voltage level, and as a result, the data voltages are applied to all the pixels PX to display images in one frame. The 1 horizontal period is also referred to as '1H' as shown in FIG. 5, and may be the same as one period of the horizontal synchronization signal Hsync and the data enable signal DE.

In an exemplary embodiment, when one frame ends, the next frame starts and a state of the reverse signal RVS applied to the data driver 300 may be controlled to allow the polarity of the data voltage applied to each pixel PX to be opposite to the polarity in the previous frame (e.g., frame inversion). In such an embodiment, even in one frame, according to a characteristic of the reverse signal RVS, a polarity of the data voltage applied to one data line may be periodically changed (e.g., row inversion and dot inversion), or polarities of data voltages applied to one pixel row may be different from each other (e.g., column inversion and dot inversion). The data voltage may be divided into a positive data voltage and a negative data voltage according to the polarity thereof. The positive data voltage may be higher than the negative data voltage for a same grayscale level.

In an exemplary embodiment, each of the signal controller 100, the gate driver 200, the data driver 300 and the gray voltage generator 400 may be directly mounted on the display unit 600 in an integrated circuit ("IC") chip form, mounted on a flexible printed circuit film (not illustrated), attached to the display unit 600 in a tape carrier package ("TCP") form, or mounted on a separate printed circuit board (not illustrated). Alternatively, the signal controller 100, the gate driver 200, the data driver 300 and the gray voltage generator 400 may be integrated on the display unit 600 together with the signal lines S1-Sn and D1-Dm.

Figure 2:
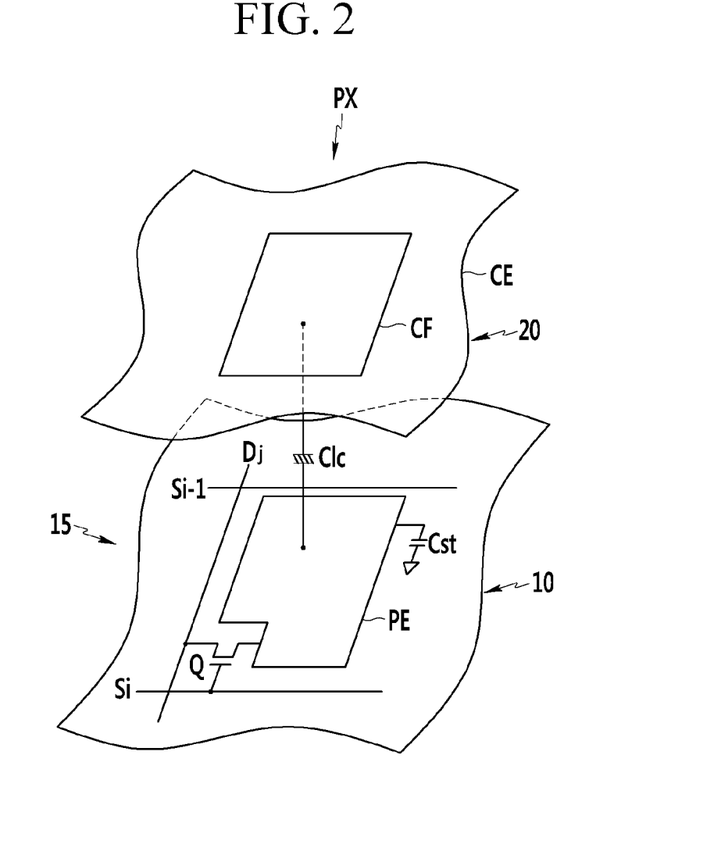
FIG. 2 is a circuit diagram illustrating an equivalent circuit of a pixel in an exemplary embodiment of the display device, according to the invention.

FIG. 2 is a circuit diagram illustrating an equivalent circuit of a pixel in an exemplary embodiment of the display device, according to the invention.

Referring to FIG. 2, a pixel PX included in an exemplary embodiment of the display unit 600 will be described. Hereinafter, a pixel PX connected to an i-th gate line Si and a j-th data line Dj (here, 1<i≤n, 1≤j≤m) will be described in detail for convenience of description. The pixel PX includes a switching element Q, and a liquid crystal capacitor Clc and a storage capacitor Cst, which are connected to the switching element Q.

The switching element Q may be a three-terminal element, such as a thin film transistor, provided on a lower panel 10. The switching element Q includes a gate terminal connected to a corresponding gate line (e.g., the i-th gat line Si) of the gate lines S1-Sn, an input terminal connected to a corresponding date line (e.g., the j-th data line Dj) of the data lines D1-Dm, and an output terminal connected to the liquid crystal capacitor Clc and the storage capacitor Cst. The thin film transistor includes amorphous silicon or polycrystalline silicon.

In one exemplary embodiment, for example, the thin film transistor may be an oxide thin film transistor ("oxide TFT") in which a semiconductor layer is configured by an oxide semiconductor.

In such an embodiment, the oxide semiconductor material may include at least one selected from oxide based on titanium (Ti), hafnium (Hf), zirconium (Zr), aluminum (Al), tantalum (Ta), germanium (Ge), zinc (Zn), gallium (Ga), tin (Sn) or indium (In), and indium-gallium-zinc oxide (In-GaZnO4), indium-zinc oxide (Zn—In—O), zinc tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O), which are complex oxides thereof.

The semiconductor layer includes a channel region in which impurities are not doped, and a source region and a drain region formed at two sides of the channel region, in which impurities are doped. Herein, the impurities vary according to a kind of thin film transistor, and may be N-type impurities or P-type impurities.

In an exemplary embodiment where the semiconductor layer includes or is formed of the oxide semiconductor, a separate passivation layer may be added to protect the oxide semiconductor vulnerable to an external environment such as exposing at a high temperature.

Two terminals of the liquid crystal capacitor Clc may be defined by a pixel electrode PE and a common electrode CE of the lower panel 10, and a liquid crystal layer 15 between the pixel electrode PE and the common electrode CE functions as a dielectric material of the liquid crystal capacitor Clc. The liquid crystal layer 15 has dielectric anisotropy. A pixel voltage is determined by a voltage difference between the pixel electrode PE and the common electrode CE.

The pixel electrode PE is connected to the switching element Q. The common electrode CE receives a common voltage Vcom. The common electrode CE may be disposed on the entire surface of the upper panel 20. In an alternative exemplary embodiment, the common electrode CE may be disposed on the lower panel 10. In such an embodiment, at least one of the pixel electrode PE and the common electrode CE may have a linear shape or a rod shape.

The storage capacitor Cst, which plays a subordinate role of the liquid crystal capacitor Clc, is defined by overlapping portions of a separate signal line (not illustrated) included in the lower panel 10 and the pixel electrode PE with an insulator therebetween, and a predetermined voltage, such as a common voltage Vcom, may be applied to the separate signal line.

In an exemplary embodiment, as shown in FIG. 2, a color filter CF may be disposed on the upper panel 20. Alternatively, the color filter CF may be disposed on or below the pixel electrode PE of the lower panel 10. Each pixel PX uniquely displays one of the primary colors, and a desired color may be recognized by a spatial sum of the primary colors. Each pixel PX alternately displays the primary colors with time, and a desired color may be recognized by a temporal sum of the primary colors. In one exemplary embodiment, for example, the primary colors may include three primary colors of red, green and blue.

Figure 3:
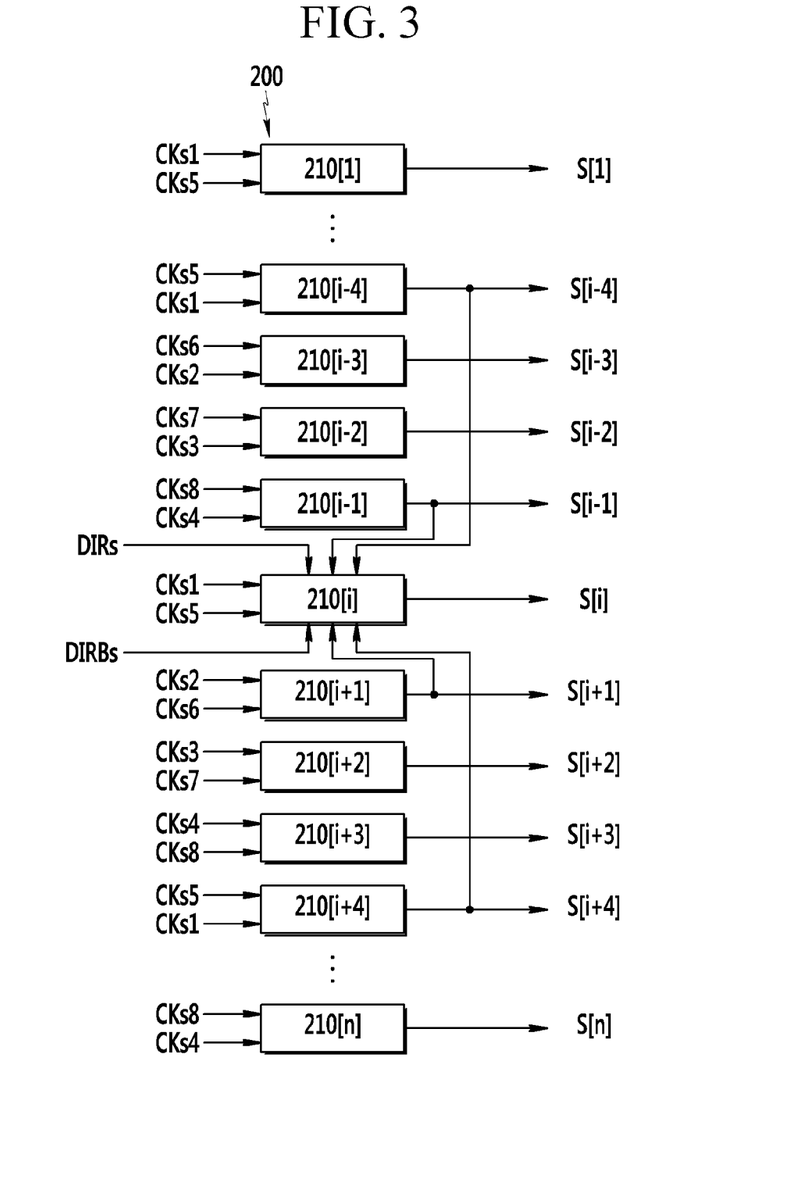
FIG. 3 is a block diagram of an exemplary embodiment of a gate driver of the display device, according to the invention.

FIG. 3 is a block diagram of an exemplary embodiment of a gate driver of the display device, according to the invention.

Referring to FIG. 3, an exemplary embodiment of the gate driver 200 includes a plurality of gate driving blocks 210[1] to 210[n]. The respective gate driving blocks 210[1] to 210[n] receive input signals to generate gate signals S[1] to S[n] which are output to the plurality of gate lines S1-Sn, respectively.

Herein, for convenience of illustration and description, the input signal input to the i-th gate driving block 210[i] is mainly illustrated, and signals input to other gate driving blocks are illustrated as only the clock signals CKs1 to CKs8 in FIG. 3.

Hereinafter, a gate driving block, e.g., the i-th gate driving block 210[*i*], will be described in detail for convenience of description.

In an exemplary embodiment, signals input to the gate driving block 210[*i*] include two clock signals, e.g., first and fifth clock signals CKs1 and CKs5, among eight clock signals, e.g., first to eighth clock signals CKs1 to CKs8, a forward driving signal DIRs, and a backward driving signal DIRBs. In such an embodiment, the gate driving block 210[i] receives an output signal S[i−4] of a fourth preceding gate driving block 210[i−4] thereof, an output signal S[i−1] of a first preceding gate driving block 210[i−1] thereof, an output signal S[i+1] of a first subsequent gate driving block 210[i+1] thereof, and an output signal S[i+4] of a fourth subsequent gate driving block 210[i+4] thereof.

In an exemplary embodiment, when the gate driver 200 is in a forward driving, that is, when the gate signals S[1] to S[n] in the gate-on voltage level are sequentially output from the gate driver 200 in a forward direction, the forward driving signal DIRs may be applied at a high-level voltage, and the backward driving signal DIRBs may be applied at a low-level voltage.

In an exemplary embodiment, when the gate driver 200 is in a backward driving, that is, when the gate signals S[1] to S[n] in the gate-on voltage level are sequentially output from the gate driver 200 in a backward direction, the forward driving signal DIRs may be applied at a low-level voltage, and the backward driving signal DIRBs may be applied at a high-level voltage.

The voltage level of the first clock signal CKs1 is changed alternately to the high-level voltage and the low-level voltage every horizontal period 1H. The second clock signal CKs2 is a clock signal in which the first clock signal CKs1 is shifted by ¼H. The third clock signal CKs3 is a clock signal in which the second clock signal CKs2 is shifted by ¼H. The fourth clock signal CKs4 is a clock signal in which the third clock signal CKs3 is shifted by ¼H. The fifth clock signal CKs5 is a clock signal in which the fourth clock signal CKs4 is shifted by ¼H. The sixth clock signal CKs6 is a clock signal in which the fifth clock signal CKs5 is shifted by ¼H. The seventh clock signal CKs7 is a clock signal in which the sixth clock signal CKs6 is shifted by ¼H. The eighth clock signal CKs8 is a clock signal in which the seventh clock signal CKs7 is shifted by ¼H.

The fifth clock signal CKs5 becomes a reverse clock signal of the first clock signal CKs1. Accordingly, in such an embodiment, two clock signals, in which one is reversed from the other, are input to each of the plurality of gate driving blocks 210[1] to 210[n], as shown in FIG. 3.

The output signal S[i−4] in the gate-on voltage level from the fourth preceding gate driving block 210[i−4] of the gate driving block 210[i] may be output earlier than the output signal S[i] in the gate-on voltage level from the gate driving block 210[i] by 1H. The output signal S[i−1] in the gate-on voltage level from the first preceding gate driving block 210[i−1] of the gate driving block 210[i] may be output earlier than the output signal S[i] in the gate-on voltage level from the gate driving block 210[i] by a first period or a first phase, e.g., ¼H. The output signal S[i+1] in the gate-on voltage level from the subsequent first gate driving block 210[i+1] of the gate driving block 210[i] may be output later than the output signal S[i] in the gate-on voltage level from the gate driving block 210[i] by ¼H. The output signal S[i+4] in the gate-on voltage level from the fourth subsequent gate driving block 210[i+4] of the gate driving block 210[i] may be output later than the output signal S[i] in the gate-on voltage level from the gate driving block 210[i] by a second period or a second phase, e.g., 1H.

Hereinafter, an exemplary embodiment of a gate driving circuit included in each of the plurality of gate driving blocks 210[1] to 210[n] and an operation thereof will be described in greater detail with reference to FIGS. 4 and 5.

Figure 4:
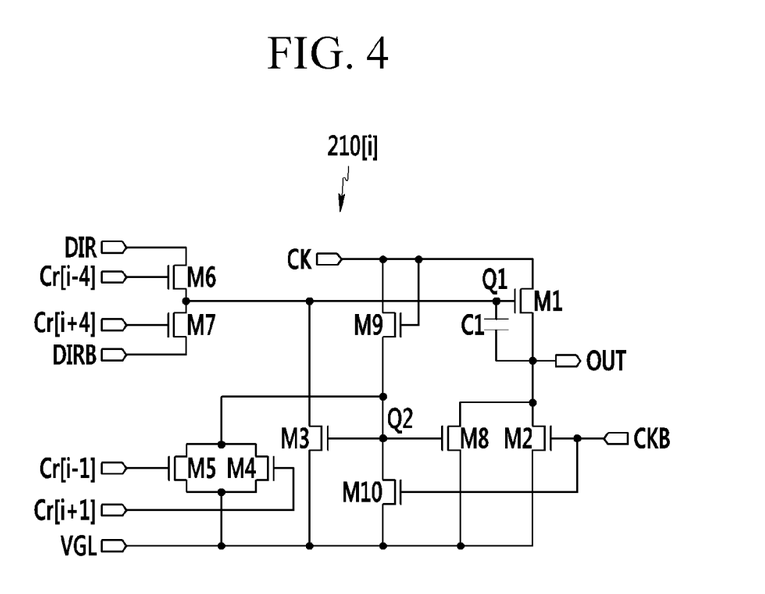
FIG. 4 is a circuit diagram of an exemplary embodiment of a gate driving circuit of the display device, according to the exemplary embodiment of the invention.

FIG. 4 is a circuit diagram of an exemplary embodiment of a gate driving circuit of a gate driving block of the display device, according to the invention. FIG. 5 is a signal timing diagram showing an operation of an exemplary embodiment of the gate driving circuit of the display device, according to the invention.

Referring to FIG. 4, an exemplary embodiment of the gate driving circuit of a gate driving block 210[i] includes a plurality of input terminals DIR, DIRB, CK, CKB, Cr[i−4], Cr[i−1], Cr[i+1], and Cr[i+4], an output terminal OUT, a plurality of transistors, e.g., first to tenth transistors M1 to M10, and a capacitor C1. In such an embodiment, the plurality of input terminals includes a forward driving input terminal DIR, a backward driving input terminal DIRB, a first clock signal input terminal CK, a second clock signal input terminal CKB, a first forward input terminal Cr[i−1], a second forward input terminal Cr[i−4], a first backward input terminal Cr[i+1], and a second backward input terminal Cr[i+4]. The output terminal OUT is connected to the gate line.

In such an embodiment, the first transistor M1 includes a gate electrode connected to a first node Q1, a first end connected to the first clock signal input terminal CK, and a second end connected to the output terminal OUT. The first transistor M1 transfers the clock signal input to the first clock signal input terminal CK to the output terminal OUT based on a voltage of the first node Q1.

In such an embodiment, the second transistor M2 includes a gate electrode connected to the second clock signal input terminal CKB, a first end connected to a low-level power voltage VGL, and a second end connected to the output terminal OUT. The second transistor M2 transfers the low-level power voltage VGL to the output terminal OUT based on the clock signal input to the second clock signal input terminal CKB.

In such an embodiment, the third transistor M3 includes a gate electrode connected to a second node Q2, a first end connected to the low-level power voltage VGL, and a second end connected to the first node Q1. The third transistor M3 transfers the low-level power voltage VGL to the first node Q1 based on a voltage of the second node Q2.

In such an embodiment, the fourth transistor M4 includes a gate electrode connected to the first forward input terminal Cr[i−1], a first end connected to the low-level power voltage VGL, and a second end connected to the second node Q2. The gate signal S[i−1] of the first preceding gate driving block 210[i−1] is input to the first forward input terminal Cr[i−1]. The fourth transistor M4 transfers the low-level power voltage VGL to the second node Q2 based on the signal input to the first forward input terminal Cr[i−1].

In such an embodiment, the fifth transistor M5 includes a gate electrode connected to the first backward input terminal Cr[i+1], a first end connected to the low-level power voltage VGL, and a second end connected to the second node Q2. The gate signal S[i+1] of the first subsequent gate driving block 210[i+1] is input to the first backward input terminal Cr[i+1]. The fifth transistor M5 transfers the low-level power voltage VGL to the second node Q2 based on the signal input to the first backward input terminal Cr[i+1].

In such an embodiment, the sixth transistor M6 includes a gate electrode connected to the second forward input terminal Cr[i−4], a first end connected to the forward driving input terminal DIR, and a second end connected to the first node Q1. The gate signal S[i−4] of the fourth precedent gate driving block 210[i−4] thereof is input to the second forward input terminal Cr[i−4]. The forward driving signal DIRs is input to the forward driving input terminal DIR. The sixth transistor M6 transfers the forward driving signal DIRs input to the forward driving input terminal DIR to the first node Q1 based on the signal input to the second forward input terminal Cr[i−4].

In such an embodiment, the seventh transistor M7 includes a gate electrode connected to the second backward input terminal Cr[i+4], a first end connected to the backward driving input terminal DIRB, and a second end connected to the first node Q1. The gate signal S[i+4] of the fourth subsequent gate driving block 210[i+4] is input to the second backward input terminal Cr[i+4]. The backward driving signal DIRBs is input to the backward driving input terminal DIRB. The seventh transistor M7 transfers the backward driving signal DIRBs input to the backward driving input terminal DIRB to the first node Q1 based on the signal input to the second backward input terminal Cr[i+4].

In such an embodiment, the eighth transistor M8 includes a gate electrode connected to the second node Q2, a first end connected to the low-level power voltage VGL, and a second end connected to the output terminal OUT. The eighth transistor M8 transfers the low-level power voltage VGL to the output terminal OUT based on the voltage of the second node Q.

In such an embodiment, the ninth transistor M9 includes a gate electrode connected to the first clock signal input terminal CK, a first end connected to the first clock signal input terminal CK, and a second end connected to the second node Q2. The ninth transistor M9 transfers the clock signal input to the first clock signal input terminal CK to the second node Q2.

In such an embodiment, the tenth transistor M10 includes a gate electrode connected to the second clock signal input terminal CKB, a first end connected to the low-level power voltage VGL, and electrode second end connected to the second node Q2. The tenth transistor M10 transfers the low-level power voltage VGL to the second node Q2 based on the clock signal input to the second clock signal input terminal CKB.

In such an embodiment, the capacitor C1 includes a first end connected to the first node Q1 and a second end connected to the output terminal OUT. The capacitor C1 stores the voltage of the first node Q1.

In an exemplary embodiment, the plurality of transistors M1 to M10 may be n-channel field effect transistors. In such an embodiment, a gate-on voltage for turning on the plurality of transistors M1 to M10 is a high level voltage, and a gate-off voltage for turning off the plurality of transistors M1 to M10 is a low level voltage. In an exemplary embodiment of at least one of the plurality of transistors M1 to M10 may be a p-channel field effect transistor. A gate-on voltage for turning on the p-channel field effect transistor is a low level voltage, and a gate-off voltage for turning off the p-channel field effect transistor is a high level voltage.

At least one of the plurality of transistors M1 to M10 may be an oxide TFT, in which the semiconductor layer includes or is formed of the oxide semiconductor.

Hereinafter, an operation of an exemplary embodiment of the gate driving circuit will be described with reference to FIG. 5. Hereinafter, for convenience of description, the operation of the gate driving circuit of the i-th gate driving block 210[i], in the forward driving, in which the gate signals S[1] to S[n] in the gate-on voltage level are output in the forward direction, will be described in detail.

In such an embodiment, when the forward driving signal DIRs is applied at the high level voltage and the backward driving signal DIRBs is applied at the low level voltage, the gate driving circuit of the i-th gate driving block 210[i] may operate the forward driving.

During a period from a first time point t1 to a second time point t2, the gate signal S[i−4] of the fourth precedent gate driving block 210[i−4] of the i-th gate driving block 210[i] is output at the high level voltage to be input to the second forward input terminal Cr[i−4] of the i-th gate driving block 210[i]. During such a period, the first clock signal CKs1 is applied to the first clock signal input terminal CK at the low level voltage, and the fifth clock signal CKs5 is applied to the second clock signal input terminal CKB at the high level voltage. Accordingly, the sixth transistor M6 is turned on by the signal input to the second forward input terminal Cr[i−4], and the forward driving signal DIRs at the high level voltage is transferred to the first node Q1. The voltage of the first node Q1 becomes the high level voltage, such that the voltage of the first node Q1 is stored in the capacitor C1. The first transistor M1 is turned on by the voltage of the first node Q1, and the first clock signal CKs1 of the low level voltage is transferred to the output terminal OUT. During such a period, the fifth clock signal CKs5 of the high level voltage is input to the second clock signal input terminal CKB such that the second transistor M2 and the tenth transistor M10 are turned on. The low-level power voltage VGL is transferred to the second node Q2 through the turned-on tenth transistor M10. The low-level power voltage VGL is transferred to the output terminal OUT through the turned-on second transistor M2. Accordingly, the gate signal S[i] in the low voltage level, that is, in the gate-off voltage level, is output from the output terminal OUT.

During a period from the second time point t2 to a third time point t3, the gate signal S[i−4] of the fourth precedent gate driving block 210[i−4] of the i-th gate driving block 210[i] and the gate signal S[i+4] of the fourth subsequent gate driving block 210[i+4] are output at the low level voltage. During such a period, the first clock signal CKs1 is applied at the high level voltage, and the fifth clock signal CKs5 is applied at the low level voltage. Since the low level voltage is input to the second forward input terminal Cr[i−4] and the second backward input terminal Cr[i+4], the sixth transistor M6 and the seventh transistor M7 are turned off. Since at least one of the gate signal S[i−1] of the first precedent gate driving block 210[i−1] of the i-th gate driving block 210[i] that is input to the first forward input terminal Cr[i−1], and the gate signal S[i+1] of the first subsequent gate driving block 210[i+1] of the i-th gate driving block 210[i] that is input to the first backward input terminal Cr[i+1] are applied at the high level voltage at the period from the second time point t2 to the third time point t3, at least one of the fourth transistor M4 and the fifth transistor M5 is turned on. The low-level power voltage VGL is transferred to the second node Q2 through at least one of the turned-on fourth transistor M5 and the eighth transistor M8. The second node Q2 becomes the low level voltage, and the third transistor M3 and the eighth transistor M8 are maintained in a turned-off state. Since the sixth transistor M6, the seventh transistor M7 and the third transistor M3 are turned off, the first node Q1 is in a floated state. At the period from the first time point t1 to the second time point t2, the voltage of the first node Q1 is stored in the capacitor C1 at the high level voltage, and at the period from the second time point t2 to the third time point t3, the first node Q1 is floated and thus the voltage of the first node Q1 is maintained at the high level voltage. The first transistor M1 is maintained in the turned-on state by the voltage of the first node Q1, and the first clock signal CKs1 at the high level voltage is transferred to the output terminal OUT. Accordingly, the gate signal S[i] in the high voltage level, that is, in the gate-on voltage level, may be output from the output terminal OUT of the i-th gate driving block 210[i]. Since the fifth clock signal CKs5 input to the second clock signal input terminal CKB has the low level voltage, the second transistor M2 and the tenth transistor M10 are turned off.

In a conventional gate driving block, waveforms of the signals input to the gate driving block may be deformed or delayed by self-resistance of the wire or a parasitic capacitor. When the fifth clock signal CKs5 input to the second clock signal input terminal CKB is deformed or delayed, the voltage of the second node Q2 is not maintained at the low level voltage at the period from the second time point t2 to the third time point t3, but may swing at the high level voltage by the first clock signal CKs1. However, in an exemplary embodiment of the invention, the fourth transistor M4 and the fifth transistor M5 are turned on based on the gate signal S[n−1] of the first preceding gate driving block 210[n−1] of the waveform earlier than the first clock signal CKs1 input to the first clock signal input terminal CK by ¼H and the gate signal S[i+1] of the first subsequent gate driving block 210[i+1] of the waveform later than the first clock signal CKs1 by ¼H, such that the voltage of the second node Q2 becomes the low level voltage earlier by ¼H and is maintained at the low level voltage later by ¼H. Accordingly, when the gate signal S[i] in the gate-on voltage level is output, the voltage of the second node Q2 may be effectively maintained at the low level voltage.

During a period from the third time point t3 to a fourth time point t4, the gate signal S[i+4] of the fourth subsequent gate driving block 210[i+4] of the i-th gate driving block 210[i] is output to the high level voltage to be input to the second backward input terminal Cr[i+4]. As a result, the seventh transistor M7 is turned on, and the backward driving signal DIRBs at the low level voltage is transferred to the first node Q1. The voltage of the first node Q1 becomes the low level voltage, and the first transistor M1 is thereby turned off. Since the first clock signal CKs1 is applied at the low level voltage, the ninth transistor M9 is turned off. During such a period, the second transistor M2 and the tenth transistor M10 are turned on by the fifth clock signal CKs5 of the high level voltage input to the second clock signal input terminal CKB. The low-level power voltage VGL is transferred to the output terminal OUT through the turned-on sixth transistor M6. Accordingly, the gate signal S[i] in the low voltage level, that is, the gate-off voltage level, is output from the output terminal OUT.

During a period from the fourth time point t4 to a fifth time point t5, the first clock signal CKs1 is applied at the high level voltage, and the fifth clock signal CKs5 is applied at the low level voltage. The ninth transistor M9 is turned on by the first clock signal CKs1, and the high level voltage is transferred to the second node Q2 through the turned-on ninth transistor M9. The voltage of the second node Q2 becomes the high level voltage, and the third transistor M3 and the eighth transistor M8 are thereby turned on. The low-level power voltage VGL is transferred to the first node Q1 through the turned-on third transistor M3 such that the voltage of the first node Q1 becomes the low level voltage, and the first transistor M1 is thereby turned off. The low-level power voltage VGL is transferred to the output terminal OUT through the turned-on eighth transistor M8. Accordingly, the gate signal S[i] in the low voltage level, that is, in the gate-off voltage level, is output from the output terminal OUT.

In such an embodiment, as described above, the plurality of gate driving blocks 210[1] to 210[n] may sequentially output the gate signals S[1] to S[n] in the gate-on voltage level.

When the plurality of gate driving blocks 210[1] to 210[n] performs the backward driving, the forward driving signal DIRs is applied at the low level voltage, and the backward driving signal DIRBs is applied at the high level voltage. In the backward driving, when the gate signal S[i+4] in the gate-on voltage level from the fourth subsequent gate driving block 210[i+4] of the i-th gate driving block 210[i] is input to the second backward input terminal Cr[i+4] of the i-th gate driving block 210[i], the backward driving signal DIRBs at the high level voltage is transferred to the first node Q1. This corresponds to the process in which the high level voltage is transferred to the first node Q1 at the period from the first time point t1 to the second time point t2 described above. The remaining driving process is performed as described above, and the gate signal S[i] in the gate-on voltage level may be output from the i-th gate driving block 210[i]. That is, the plurality of gate driving blocks 210[1] to 210[n] may sequentially output the gate signals S[n] to S[1] in the gate-on voltage level in the backward direction.

As described above, an exemplary embodiment of the gate driving circuit according to the invention includes a single capacitor C1 to perform the forward driving and the backward driving. In such an embodiment, where a single capacitor C1 is included in the gate driving circuit, the layout area of the gate driving circuit and the power consumption may be substantially reduced. As a result, in such an embodiment, the non-display area of the display device may be substantially reduced, and the power consumption of the display device may be effectively reduced.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device, comprising:
a plurality of pixels;
a plurality of gate lines connected to the plurality of pixels;
an output terminal connected to a gate line of the plurality of gate lines;
a first transistor including a gate electrode connected to a first node, a first end connected to a first clock signal input terminal, and a second end connected to the output terminal;
a second transistor including a gate electrode connected to a second clock signal input terminal, a first end connected to a low-level power voltage, and a second end connected to the output terminal;
a third transistor including a gate electrode connected to a second node, a first end connected to the low-level power voltage, and a second end connected to the first node;

a fourth transistor including a gate electrode connected to a first forward input terminal, to which a gate signal earlier than the gate signal output from the output terminal by a first period is input, a first end connected to the low-level power voltage, and a second end connected to the second node;

a fifth transistor including a gate electrode connected to a first backward input terminal, to which a gate signal later than the gate signal output from the output terminal by the first period is input, a first end connected to the low-level power voltage, and a second end connected to the second node;

a sixth transistor including a gate electrode connected to a second forward input terminal, to which a gate signal earlier than the gate signal output from the output terminal by a second period is input, a first end connected to a forward driving input terminal, and a second end connected to the first node; and a seventh transistor including a gate electrode connected to a second backward input terminal, to which a gate signal later than the gate signal output from the output terminal by the second period is input, a first end connected to a backward driving input terminal, and a second end connected to the first node, wherein the first period is one-fourth of the second period.

2. The display device of claim 1, further comprising:
an eighth transistor including a gate electrode connected to the second node, a first end connected to the low-level power voltage, and a second end connected to the output terminal.

3. The display device of claim 2, further comprising:
a ninth transistor including a gate electrode connected to the first clock signal input terminal, a first end connected to the first clock signal input terminal, and a second end connected to the second node.

4. The display device of claim 3, further comprising:
a tenth transistor including a gate electrode connected to the second clock signal input terminal, a first end connected to the low-level power voltage, and a second end connected to the second node.

5. The display device of claim 4, further comprising:
a capacitor including a first end connected to the first node and a second end connected to the output terminal.

6. The display device of claim 5, wherein
at least one of the first transistor, the second transistor, the third transistor, the fourth transistor, the fifth transistor, the sixth transistor, the seventh transistor, the eighth transistor, the ninth transistor and the tenth transistor is an n-channel field effect transistor.

7. The display device of claim 5, wherein
at least one of the first transistor, the second transistor, the third transistor, the fourth transistor, the fifth transistor, the sixth transistor, the seventh transistor, the eighth transistor, the ninth transistor and the tenth transistor is an oxide thin film transistor.

8. The display device of claim 5, wherein
during a forward driving in which a plurality of gate signals are sequentially applied to the plurality of gate lines connected to the plurality of pixels in a forward direction, the forward driving signal input to the forward driving input terminal is in a gate-on voltage level, and the backward driving signal input to the backward driving input terminal is in a gate-off voltage level.

9. The display device of claim 5, wherein
during a backward driving in which a plurality of gate signals are sequentially applied to the plurality of gate lines connected to the plurality of pixels in a backward direction, the forward driving signal input to the forward driving input terminal is in a gate-off voltage level, and the backward driving signal input to the backward driving input terminal is in a gate-on voltage level.

10. The display device of claim 5, wherein
the first period is one-fourth of one horizontal period, and the second period is the one horizontal period.

11. The display device of claim 5, wherein
a clock signal input to the second clock signal input terminal is a reverse signal of a clock signal input to the first clock signal input terminal.

12. The display device of claim 11, wherein
when the gate signal in a gate-on voltage level is input to the second forward input terminal, the clock signal input to the second clock signal input terminal is in the gate-on voltage level.

13. The display device of claim 12, wherein
when the gate signal in the gate-on voltage level is input to the second forward input terminal, the gate signal in a gate-off voltage level is output from the output terminal.

14. The display device of claim 12, wherein
when the gate signal in the gate-on voltage level is input to the second forward input terminal, the capacitor is charged at a voltage input to the forward driving input terminal.

15. The display device of claim 14, wherein
when the clock signal input to the first clock signal input terminal is in the gate-on voltage level after the capacitor is charged, at least one of the gate signal input to the first forward input terminal and the gate signal input to the second forward input terminal is in the gate-on voltage level.

16. The display device of claim 15, wherein
when the clock signal input to the first clock signal input terminal is in the gate-on voltage level, at least one of the gate signal input to the first forward input terminal and the gate signal input to the first backward input terminal is in the gate-on voltage level, and the first node is in a floated state.

17. The display device of claim 16, wherein
when the clock signal input to the first clock signal input terminal is in the gate-on voltage level, the voltage of the second node becomes a gate-off voltage earlier by the first period and is maintained at the gate-off voltage later by the first period.

18. The display device of claim 16, wherein
when the first node is in the floated state, the clock signal in the gate-on voltage level and input to the first clock signal input terminal is transferred to the output terminal, and the gate signal in a gate-on voltage level is output from the output terminal.

19. A display device, comprising:
a plurality of pixels;
a plurality of gate lines connected to the plurality of pixels; and
a plurality of gate driving blocks connected to the plurality of gate lines, respectively,
wherein a gate driving block of the plurality of gate driving blocks comprises:
an output terminal connected to a corresponding gate line of the plurality of gate lines;

a first transistor including a gate electrode connected to a first node, a first end connected to a first clock signal input terminal, and a second end connected to the output terminal;

a second transistor including a gate electrode connected to a second clock signal input terminal, a first end connected to a low-level power voltage, and a second end connected to the output terminal;

a third transistor including a gate electrode connected to a second node, a first end connected to the low-level power voltage, and a second end connected to the first node;

a fourth transistor including a gate electrode connected to a first forward input terminal, to which a gate signal earlier than the gate signal output from the output terminal by a first period is input, a first end connected to the low-level power voltage, and a second end connected to the second node;

a fifth transistor including a gate electrode connected to a first backward input terminal, to which a gate signal later than the gate signal output from the output terminal by the first period is input, a first end connected to the low-level power voltage, and a second end connected to the second node;

a sixth transistor including a gate electrode connected to a second forward input terminal, to which a gate signal earlier than the gate signal output from the output terminal by a second period is input, a first end connected to a forward driving input terminal, and a second end connected to the first node; and a seventh transistor including a gate electrode connected to a second backward input terminal, to which a gate signal later than the gate signal output from the output terminal by the second period is input, a first end connected to a backward driving input terminal, and a second end connected to the first node, wherein the first period is one-fourth of the second period.

20. The display device of claim 19, wherein the gate driving block further comprises:
the first period is one-fourth of one horizontal period and the second period is the one horizontal period.

21. The display device of claim 20, wherein the gate driving block further comprises:
an eighth transistor including a gate electrode connected to the second node, a first end connected to the low-level power voltage, and a second end connected to the output terminal.

22. The display device of claim 21, wherein the gate driving block further comprises:
a ninth transistor including a gate electrode connected to the first clock signal input terminal, a first end connected to the first clock signal input terminal, and a second end connected to the second node; and
a tenth transistor including a gate electrode connected to the second clock signal input terminal, a first end connected to the low-level power voltage, and a second end connected to the second node.

23. The display device of claim 21, wherein the gate driving block further comprises:
a single capacitor including a first end connected to the first node and a second end connected to the output terminal.

* * * * *